US011917786B2

(12) United States Patent
Alvarado et al.

(10) Patent No.: US 11,917,786 B2
(45) Date of Patent: Feb. 27, 2024

(54) MULTI-PURPOSE STORAGE MODULE FOR INFORMATION TECHNOLOGY EQUIPMENT

(71) Applicant: Dell Products, L.P., Round Rock, TX (US)

(72) Inventors: Daniel Alvarado, Pflugerville, TX (US); Jean Marie Doglio, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 17/813,617

(22) Filed: Jul. 20, 2022

(65) Prior Publication Data

US 2024/0032233 A1    Jan. 25, 2024

(51) Int. Cl.
*H05K 7/14*        (2006.01)
*H05K 5/02*        (2006.01)
*H05K 7/20*        (2006.01)

(52) U.S. Cl.
CPC .......... *H05K 7/1489* (2013.01); *H05K 5/023* (2013.01); *H05K 7/1487* (2013.01); *H05K 7/1491* (2013.01); *H05K 7/20136* (2013.01)

(58) Field of Classification Search
CPC .... H05K 7/1489; H05K 5/023; H05K 7/1487; H05K 7/1491; H05K 7/20136
See application file for complete search history.

(56) References Cited

U.S. PATENT DOCUMENTS

| 10,420,234 | B1* | 9/2019 | Mao | G06F 1/186 |
|---|---|---|---|---|
| 10,863,644 | B1* | 12/2020 | Tseng | H05K 7/1487 |
| 11,288,122 | B1* | 3/2022 | Fleisher | G06F 1/187 |
| 11,665,848 | B2* | 5/2023 | Wang | H05K 5/023 312/330.1 |
| 2009/0273901 | A1* | 11/2009 | Jaramillo | H05K 7/1492 361/679.58 |
| 2016/0381836 | A1* | 12/2016 | Hall | H05K 7/20718 361/679.48 |
| 2018/0157295 | A1* | 6/2018 | Zhu | H05K 5/023 |
| 2021/0385962 | A1* | 12/2021 | Chang | H05K 5/023 |
| 2022/0312623 | A1* | 9/2022 | Chang | H05K 7/1489 |
| 2022/0386497 | A1* | 12/2022 | Wang | H05K 7/1489 |

* cited by examiner

*Primary Examiner* — James Wu
*Assistant Examiner* — Christopher L Augustin
(74) *Attorney, Agent, or Firm* — Fogarty LLP

(57) ABSTRACT

In one embodiment, an information technology (IT) equipment enclosure comprises a first portion of a chassis configured with one or more compute devices fixedly mounted to the chassis and a second portion of the chassis configured to receive a removable storage tray module, the storage tray module configured with one or more storage devices and one or more cooling devices. The removable storage tray module comprising a handle that is pivotable between a locked position and an unlocked position. The handle comprises a recessed portion that is configured to route cables to the storage devices when the handle is in the locked position. The handle may engage a sidewall of the chassis when in the locked position. The cooling devices are selected based upon the one or more storage devices on the storage tray module. The cooling devices may be fans.

19 Claims, 8 Drawing Sheets

MULTI-PURPOSE STORAGE MODULE FOR INFORMATION TECHNOLOGY EQUIPMENT

FIELD

The present disclosure generally relates to Information Handling Systems and, more particularly, to a modular storage solution for an information technology enclosure.

BACKGROUND

An Information Handling System (IHS) generally processes, compiles, stores, and/or communicates information or data for business, personal, or other purposes. IHSs may include a variety of hardware and software components that are configured to process, store, and communicate information and may include one or more computer systems, data storage systems, and networking systems. Groups of IHSs may be housed within data center environments. A data center may include a large number of IHSs, such as server chassis that are stacked and installed within racks. A data center may include large numbers of such server racks that are organized into rows of racks. Administration of such large groups of IHSs may require teams of remote and local administrators working in shifts in order to support around-the-clock availability of the data center operations while minimizing any downtime.

Each rack may include a number of Information Technology (IT) equipment enclosures. These IT enclosures traditionally feature specific sheet metal housings that are hard tooled for production. While a particular IT enclosure may be used for different product solutions, the specific mounting features required for different hardware components makes this difficult. As a result, products having different hardware combinations usually require unique enclosures.

Traditional storage solutions for IT enclosures are not flexible. Often, an IT enclosures will have a storage module mated with a separate compute module to form a complete system. For example, a full storage module may be attached as a front end of an IT enclosure that is paired with different compute modules. This allows different storage solutions to be used; however, this method requires specialized assembly fixtures (e.g., rails, brackets, etc.) to ensure proper installation and connection of the storage module to the compute module. For this reason, such assembly is only done at the enclosure manufacturer's facility. The IT enclosure is provided to an L10 factory as a single complete unit with no ability to swap out storage modules for product flexibility. Additionally, there is no option for a field upgrade option where one storage solution can be exchanged for another.

SUMMARY

In one embodiment, an information technology (IT) equipment enclosure comprises a first portion of a chassis configured with one or more compute devices fixedly mounted to the chassis and a second portion of the chassis configured to receive a removable storage tray module, the storage tray module configured with one or more storage devices and one or more cooling devices. The removable storage tray module comprising a handle that is pivotable between a locked position and an unlocked position. The handle comprises a recessed portion that is configured to route cables to the storage devices when the handle is in the locked position. The handle may engage a sidewall of the chassis when in the locked position. The cooling devices are selected based upon the one or more storage devices on the storage tray module. The cooling devices may be fans. The storage devices may comprise one or more of a Solid-State Drive (SSD), a Boot Optimized Storage Solution (BOSS), and a Redundant Array of Independent Disks (RAID) storage.

In another embodiment, an information handling system comprises one or more compute components, a chassis configured with infrastructure components arranged for housing the one or more compute components, the one or more compute components fixedly attached to the chassis, and a removeable storage tray having one or more storage components and one or more cooling components, wherein all of the storage components for the IHS can be changed by replacing the removeable storage tray. The chassis may be configured for components on two levels, wherein the removeable storage tray is configured to fit in a portion of an upper level. The removeable storage tray may be configured to accept storage components having two or more different form factors.

The removable storage tray may further include a handle, wherein the handle is pivotable between a locked position and an unlocked position. The handle may include a recessed portion that is configured to route cables to the one or more storage components when the handle is in the locked position. The handle may engage a sidewall of the chassis when in the locked position.

The one or more cooling components may be selected based upon the one or more storage devices on the removeable storage tray. The one or more cooling components may be fans.

The storage devices may comprise one or more of a Solid-State Drive (SSD), a Boot Optimized Storage Solution (BOSS), and a Redundant Array of Independent Disks (RAID) storage. The removeable storage tray may further include a power board, where the power board is configured to manage power for the one or more compute components.

In a further embodiment, a computing system comprises a chassis adapted to receive information technology (IT) equipment arranged on a first level and a second level, one or more compute devices fixedly mounted to the chassis in the first level and the second level, and a removeable storage module coupled to the chassis in the second level, the removeable storage module having one or more storage components and one or more cooling components. The removable storage module includes a handle that is handle pivotable between a locked position and an unlocked position. The handle has a recessed portion that is configured to route cables to the one or more storage components when the handle is in the locked position. The handle engages a sidewall of the chassis when in the locked position. The cooling components may be fans, where the number of fans are selected based upon a configuration of the one or more storage components on the removeable storage module. The storage components are selected from one or more of a Solid-State Drive (SSD), a Boot Optimized Storage Solution (BOSS), and a Redundant Array of Independent Disks (RAID) storage.

BRIEF DESCRIPTION OF THE DRAWINGS

The present invention(s) is/are illustrated by way of example and is/are not limited by the accompanying figures. Elements in the figures are illustrated for simplicity and clarity and have not necessarily been drawn to scale.

DETAILED DESCRIPTION

Figure 1:
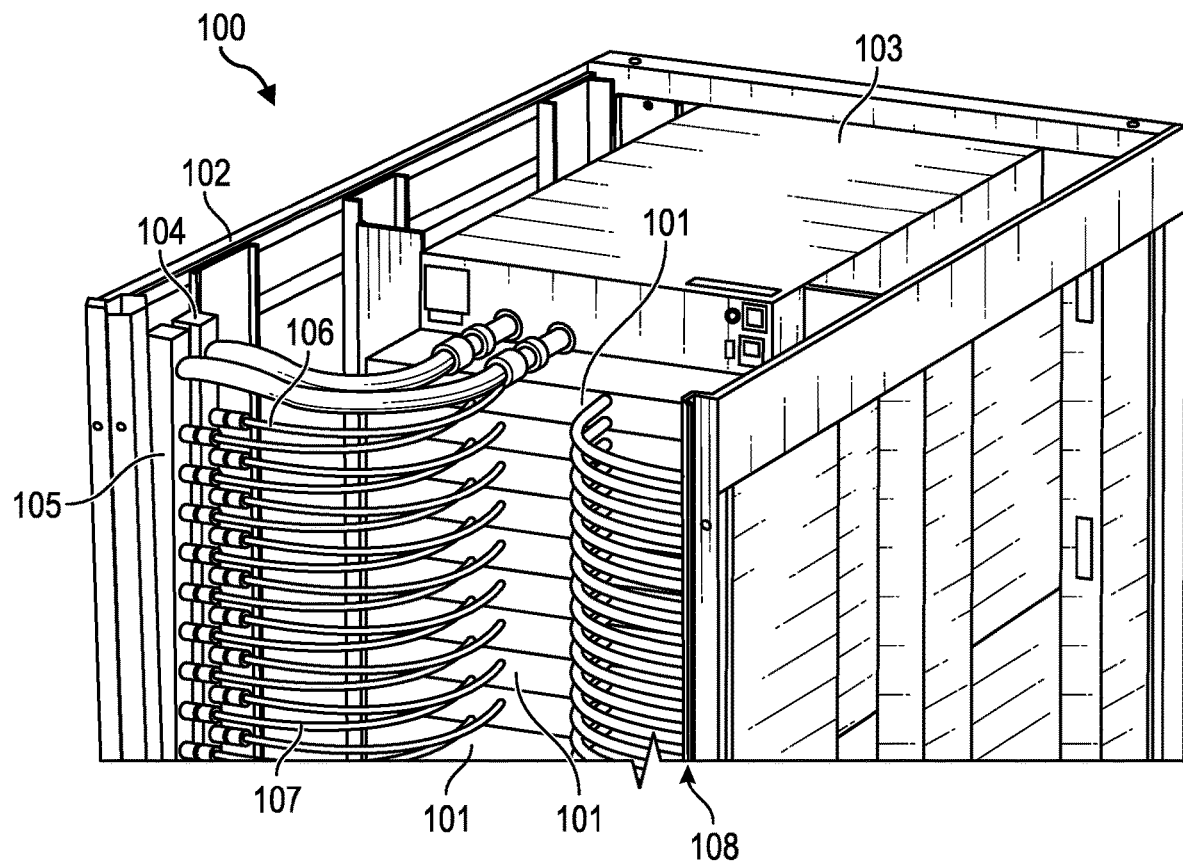
FIG. 1 is a partial, perspective view illustrating an example computing rack that may be used to mount one or more information technology enclosures according to an example embodiment.

The illustrative embodiments provide various aspects of a modular chassis design and for use with a rack assembly. The chassis has height, depth, and width dimensions that enable insertion of a plurality of different sizes of IT gear in IT enclosures.

In the following detailed description of exemplary embodiments, it is to be understood that the specific details presented need not be utilized to practice embodiments of the present disclosure. It is also to be understood that other embodiments may be utilized, and that logical, architectural, programmatic, mechanical, electrical, and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments," or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

It is understood that the use of specific component, device, and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Further, those of ordinary skill in the art will appreciate that the hardware components and basic configuration depicted in the various figures and described herein may vary. For example, the illustrative components within the example chassis are not intended to be exhaustive, but rather are representative to highlight components that can be utilized to implement various aspects of the present disclosure. For example, other devices, components, or modules may be used in addition to or in place of the hardware and software modules depicted. The depicted examples do not convey or imply any architectural or other limitations with respect to the presently described embodiments and/or the general disclosure.

FIG. 1 is a partial, perspective view illustrating an example computing rack 100 that may be used to mount one or more IT enclosures 101, such as information technology chassis, according to an example embodiment. The IT enclosures 101 may support information handling systems, such as servers. Rack-based information handling systems enable larger scale systems to be deployed in a single structure, such as a rack 100. These racks can hold a plurality of individual servers or server nodes (generally, "information technology (IT) gear"), which can be fully functional units. These individual units may function as self-managed systems and are thus each equipped with individual cooling and power controls and localized system management, independent of other systems within the rack. These IT gear are also designed to fit within the specific rack configuration and are typically of a standard width and depth dimension to fit within the rack structure. Also, depending on the particular rack, the IT gear are design with a standard uniform height that is determined solely by the pre-determined singular height of IT gear the specific rack is design to have inserted therein.

Computing rack 100 includes a frame structure 102, such as side panels with rails or brackets, for mounting multiple IT enclosures 101. The frame structure 102 may also be used to mount a liquid recirculation system 103 that pumps chilled liquid through a liquid cooled segment (not shown) in each IT enclosures 101. Liquid recirculation system 103 cools heated liquid that is returned from the IT enclosures 101.

The IT enclosures 101 may be dimensioned to fit in any suitable type and size of computing rack 100. Examples of suitable computing racks 100 that IT enclosures 101 may be dimensioned for include racks that are generally referred to as 19-inch (482.6 mm) racks or 23-inch (584.2 mm) racks. The 19-inch racks may be constructed according to various specifications, such as the Electronics Industries Alliance 310-D (EIA 310D) specification. Although 23-inch racks are often used by the telecommunication industry, 19-inch racks may be relatively more common with other computing system implementations. In general, these computing racks typically comprise a structure in which one or more IT enclosures 101 and other equipment modules may be mounted.

Computing rack 100 includes an inlet coolant manifold 104 for distributing cooled liquid from liquid recirculation system 103 to IT enclosures 101 and an outlet coolant manifold 105 for receiving heated liquid from IT enclosures 101. Inlet manifold fluidly couples an outlet of liquid recirculation system 103 to the inlet tube 106 for each IT enclosure 101. Outlet manifold 105, on the other hand, fluidly couples an inlet of liquid recirculation system 103 to the outlet tube 107 of each IT enclosure 101. Thus, inlet manifold 104 and outlet manifold 105 enable the cooling of multiple IT enclosures 101 to be provided by a single cooling source (e.g., liquid recirculation system 103). While all IT enclosures 101 configured in computing rack 100 are shown to be provided by a single liquid recirculation system 103, it should be appreciated that, in other embodiments, each IT enclosures 101 may be individually provided by a corresponding number of multiple cooling sources.

Computing rack 100 may have additional components (not shown), such as power modules and management module to provide rack-level power and management. Cabling 108 may provide connections to each IT enclosure 101 for power, Ethernet, or other networking, management, or control connections.

Figure 2A:
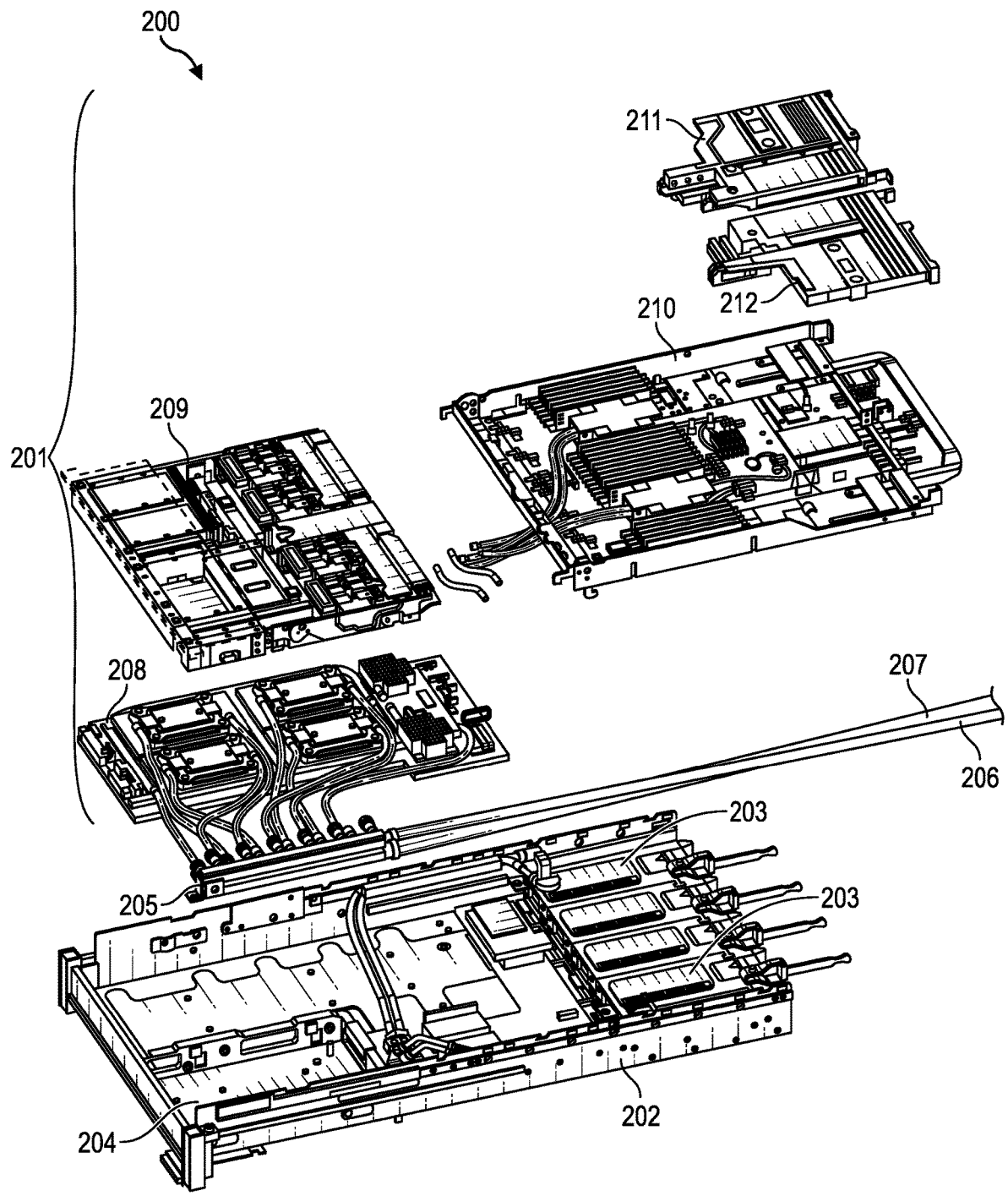
FIG. 2A is an exploded view showing components of an example IT enclosure.
Figure 2B:
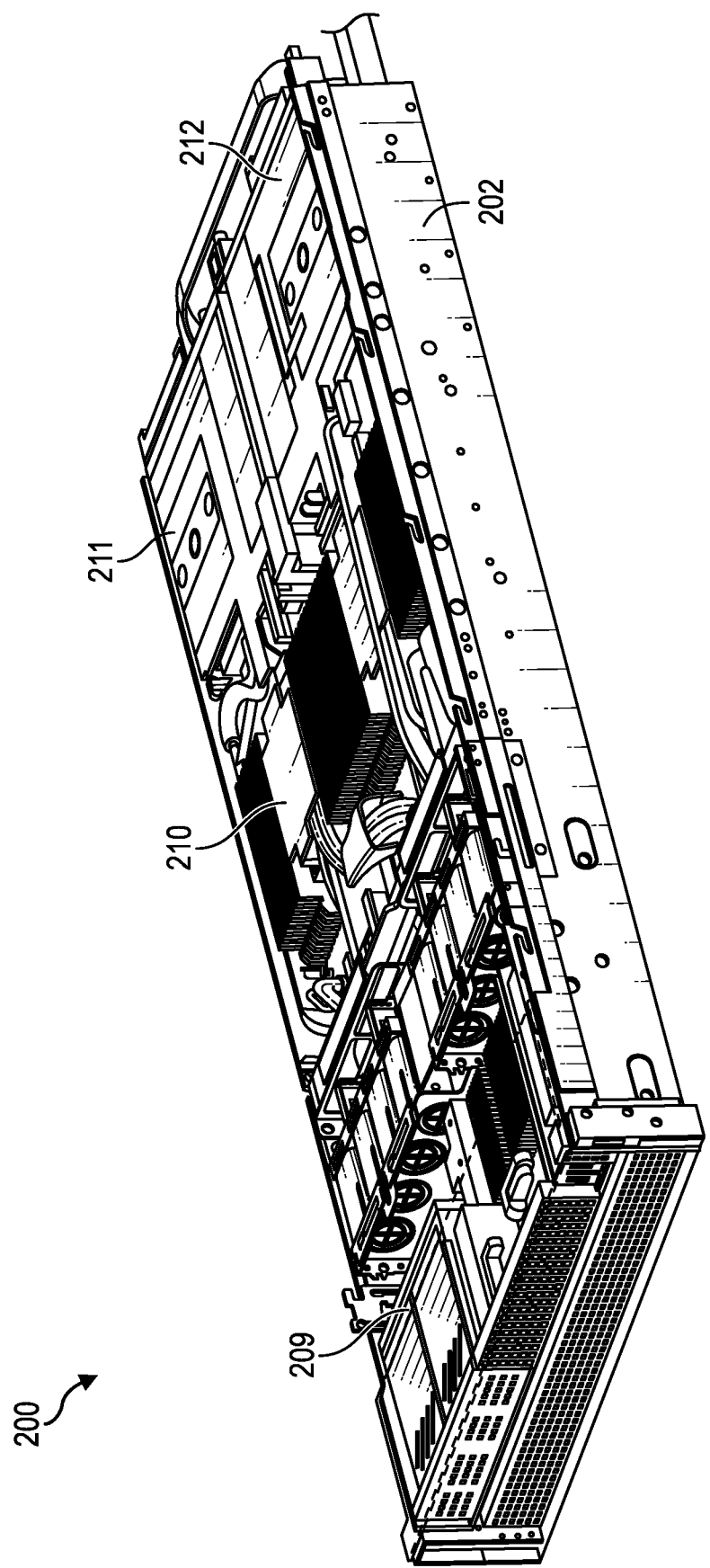
FIG. 2B illustrates the components shown in FIG. 2A combined into the IT enclosure.

FIGS. 2A and 2B illustrate an example IT enclosure 200 having a number of components 201, which are shown as an exploded view in FIG. 2A and as a deployed configuration in FIG. 2B. IT enclosure 200 may be used for an IHS. For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a handheld device, personal computer, a server, a network storage device, or any other suitable device and may vary in size, shape, performance, functionality, and price. The information handling system may include one or more processing resources (such as a Central Processing Unit (CPU), Graphics Processing Unit (GPU), or hardware or software control logic), Random Access Memory (RAM), Read Only Memory (ROM), and/or other types of nonvolatile or volatile memory. Additional components of the information handling system may include one or more disk drives, one or more network ports for communicating with external devices as well as various input and output (I/O) devices, such as a keyboard, a mouse, and a video display. The IHS may also include one or more buses operable to transmit communications between the various hardware components.

IT enclosure 200 includes a chassis 202 configured to hold infrastructure components 201. Chassis 202 has a width and length that are sized as appropriate for mounting in a rack assembly, such as rack 100 (FIG. 1). Chassis 202 in the illustrated example has a height of two rack units. As utilized herein, a rack unit (U or RU) is a unit of measure that describes the height of equipment designed to mount in a 19-inch rack or a 23-inch rack. The width of the equipment that can be mounted inside the rack is less that the width of the mounting frame, but different widths may be supported. One rack unit is 1.75 inches (44.45 mm) high. A 19-inch rack is a standardized frame or enclosure for mounting multiple equipment modules. Each IT enclosure 200 has a front panel that is substantially 19 inches wide, including edges or ears that protrude on each side to allow the module to be fastened to the rack frame with screws.

Components 201 are arranged on two levels in chassis 202, where each level is one rack unit high. A lower level includes power supply units 203, a cooling liquid line routing apparatus 204, a cooling liquid manifold 205, input cooling liquid line 206, output liquid line 207, and a GPU module 208 shown with four GPUs. An upper level includes a storage module 209, a CPU module 210, and first and second Peripheral Component Interconnect Express (PCIe) riser cards 211, 212 for connecting data signals to components 201.

Traditional IT equipment enclosures have specific sheet metal housings that are hard tooled for production. While it is common to try to leverage existing enclosures for use in different product solutions, the specific mounting features required for different hardware components makes this difficult. Product offerings with different hardware usually require new enclosures. The tooling cost for a typical IT enclosure is very high. This particularly applies to storage as the different form factors for different types of storage pose challenges when trying to use a particular IT enclosure without new enclosure tooling. It is ideal to be able to leverage a primary IT enclosure for multiple hardware options. This particularly applies to storage solutions because the different form factors for different storage types pose challenges to make different storage types available in the same IT enclosure without new enclosure tooling. As illustrated by the embodiments and arrangements disclosed herein, to add flexibility in IT equipment for items such as storage, modular drive bays, or storage modules 209 may be used. The example embodiments herein leverage a primary IT enclosure for multiple hardware options.

Figure 3A:
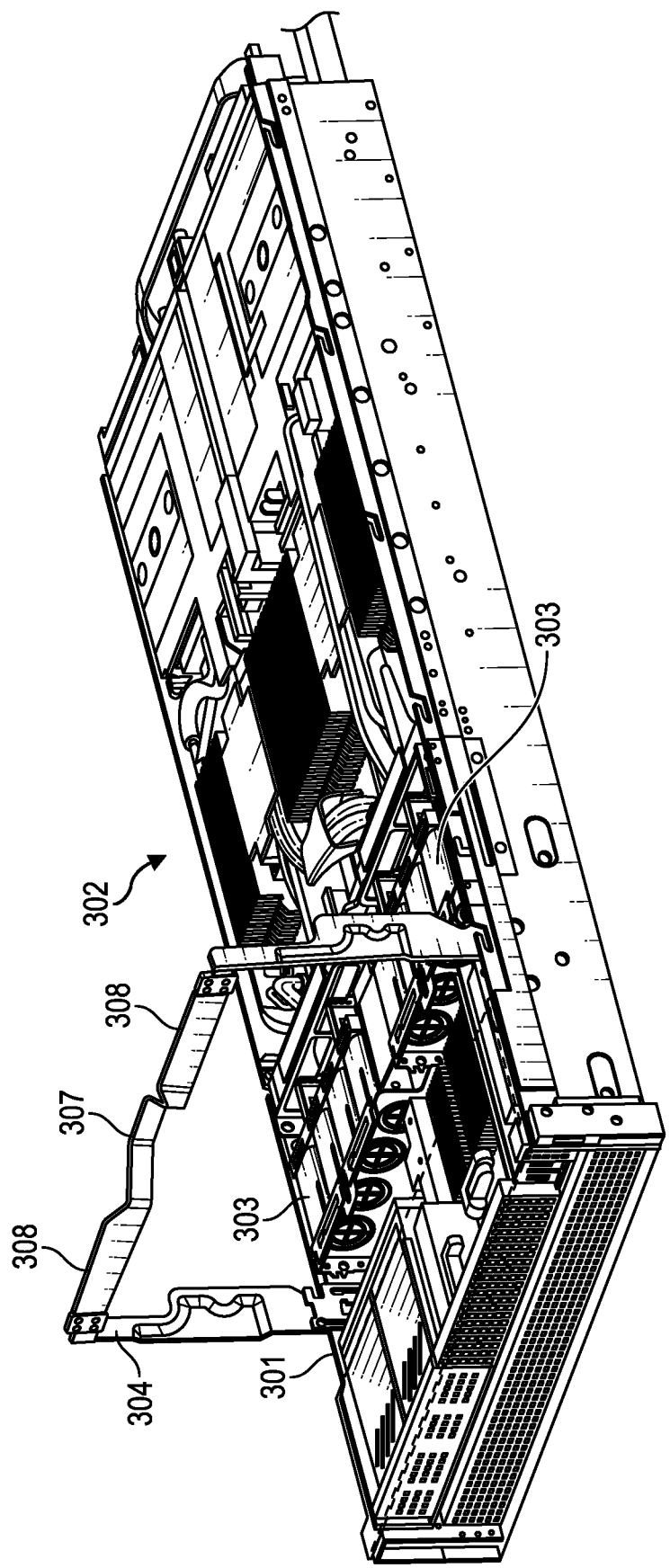
FIGS. 3A and 3B illustrate a removable/replaceable storage module for an IT enclosure according to an example embodiment.
Figure 3B:
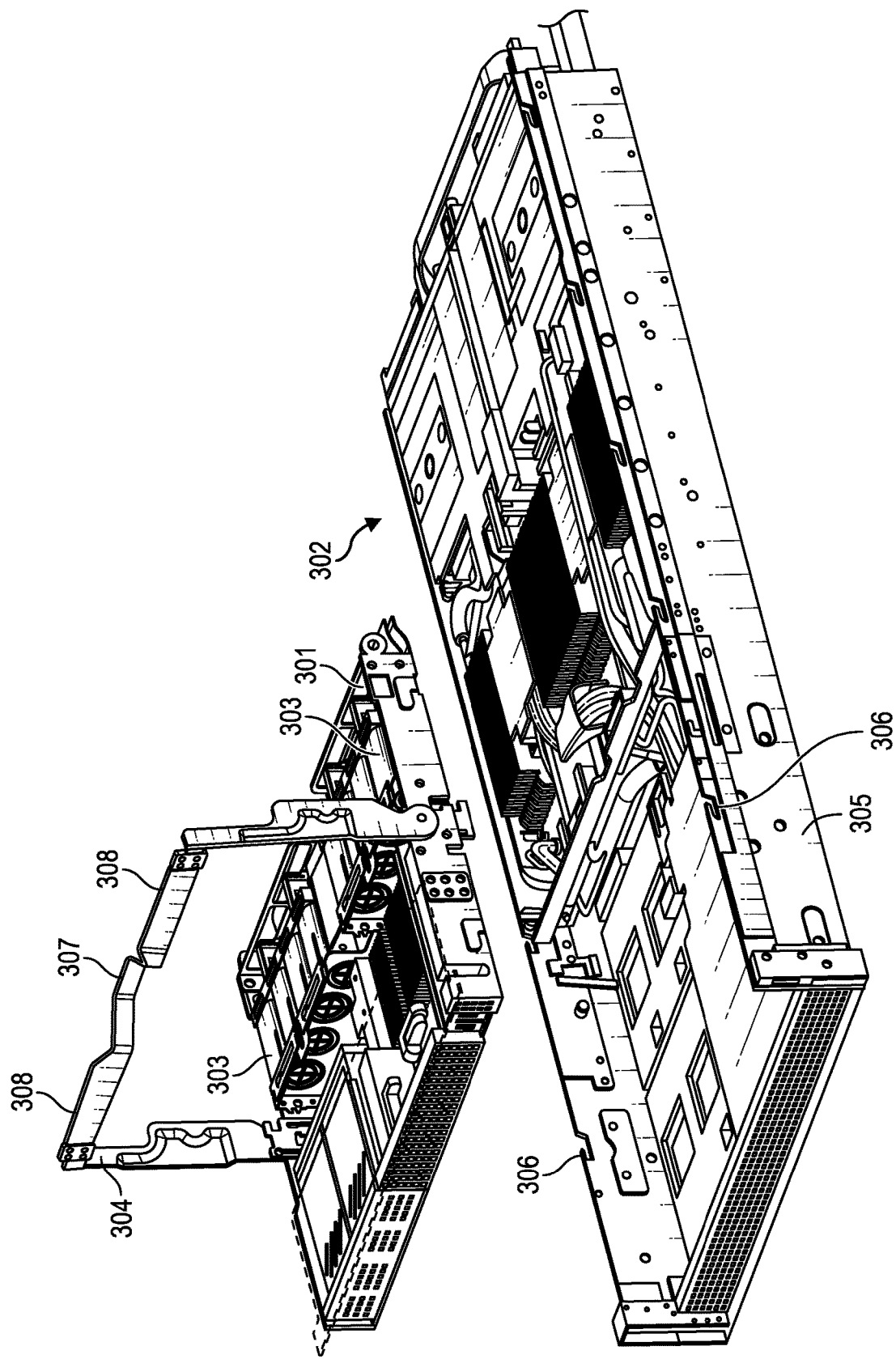

FIGS. 3A and 3B illustrate a removable/replaceable storage module 301 for an IT enclosure 302 according to an example embodiment. Storage tray 301 has a plurality of cooling units 303, such as fans, that allow for a customized the thermal environment based upon the storage solution included in tray 301. The inclusion of cooling units 303 and the customization of the cooling solution on tray 301 provides considerable flexibility for the potential storage solutions that are available while still utilizing the same base IT enclosure 302. Storage tray 301 include a particular storage solution (i.e., various storage types) having differing form factors.

Storage tray 301 provides maximum flexibility for placement of various types of storage solutions. Cooling units 303 may be selected to customize the thermal environment to match specific storage component types that are arranged in different locations in storage tray 301. The variations in storage types and arrangements are accomplished in storage tray 301 without affecting the placement of other components in IT enclosure 302 (e.g., components 203-208, 210-212 in FIG. 2).

Storage tray 301 enables an easily swappable storage complex in IT enclosure 302. Multiple storage solutions can be offered while using the same base IT enclosure 302. This minimizes the tooling cost of offering different storage solutions and enabling a wider variety of options. The ease of the installation of storage module 301 makes IT enclosure 302 an easily configurable item at an L10 factory.

A storage tray handle 304 is shown in the raised position in FIG. 3A and in the lowered/stowed position in FIG. 2B. Storage tray handle 304 can be used to remove storage tray 301 from IT enclosure 302 as shown in FIG. 3B. Storage tray handle 304 is configured to pivot between the lowered position and the raised position. In some embodiments, handle 304 may lock onto the IT enclosure chassis 305 when handle 304 is lowered. For example, pins on handle 304 may engage slots 306 on the sidewall of chassis 305 to ensure secure engagement of the storage tray 301 in IT enclosure 302.

Storage tray handle 304 may also include a recessed portion 307 that is offset from a top handle portion 308. The recessed portion 307 is configured to be below the top handle portion 308 when handle 304 is in the lowered position. In one embodiment, recessed portion 307 provides space for cable connections to run over handle 304 when lowered. For example, when storage tray is installed in IT enclosure 302 and handle 304 is lowered to lock storage tray 301 in position, cables may be routed over recessed portion 307 to couple storage devices on storage tray 301 to other components in IT enclosure 302. By routing the cables over recessed portion 307, a user will be forced to disconnect the cable connections before raising handle 304 and removing storage tray 301 from IT enclosure 302.

Figure 4A:
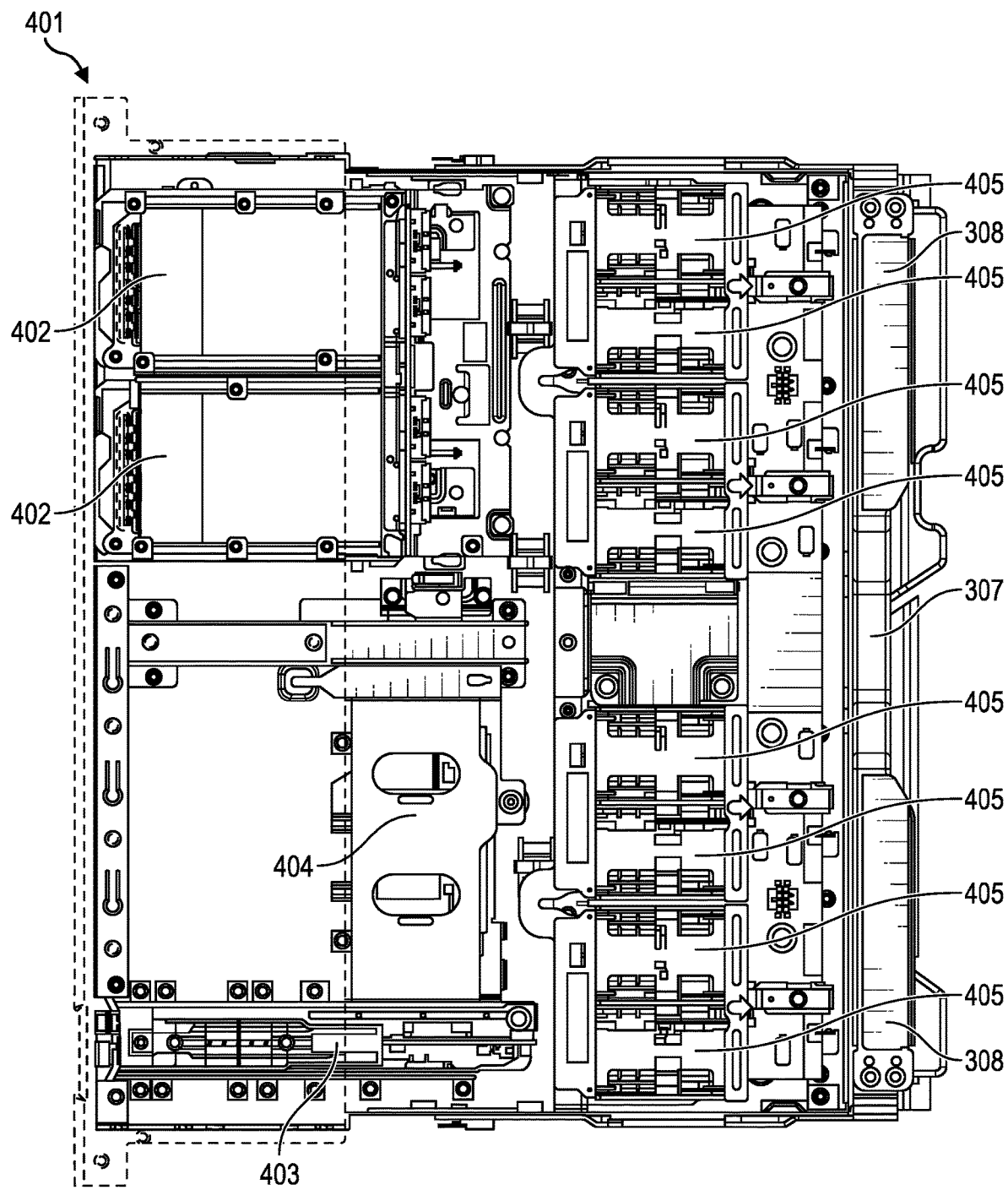
FIGS. 4A-C illustrate various exemplary embodiments of a modular storage tray for use with an IT enclosure.
Figure 4B:
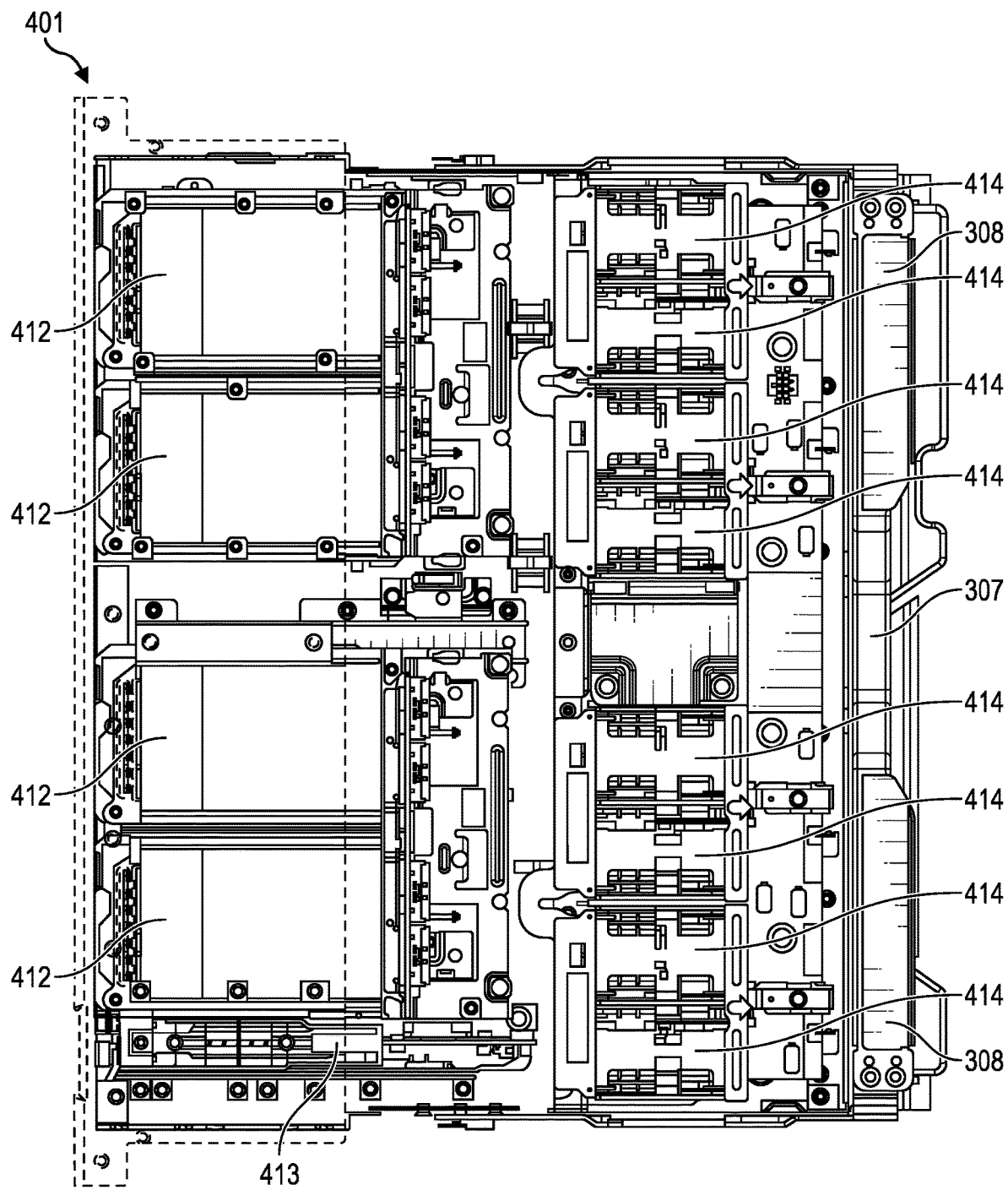
Figure 4C:
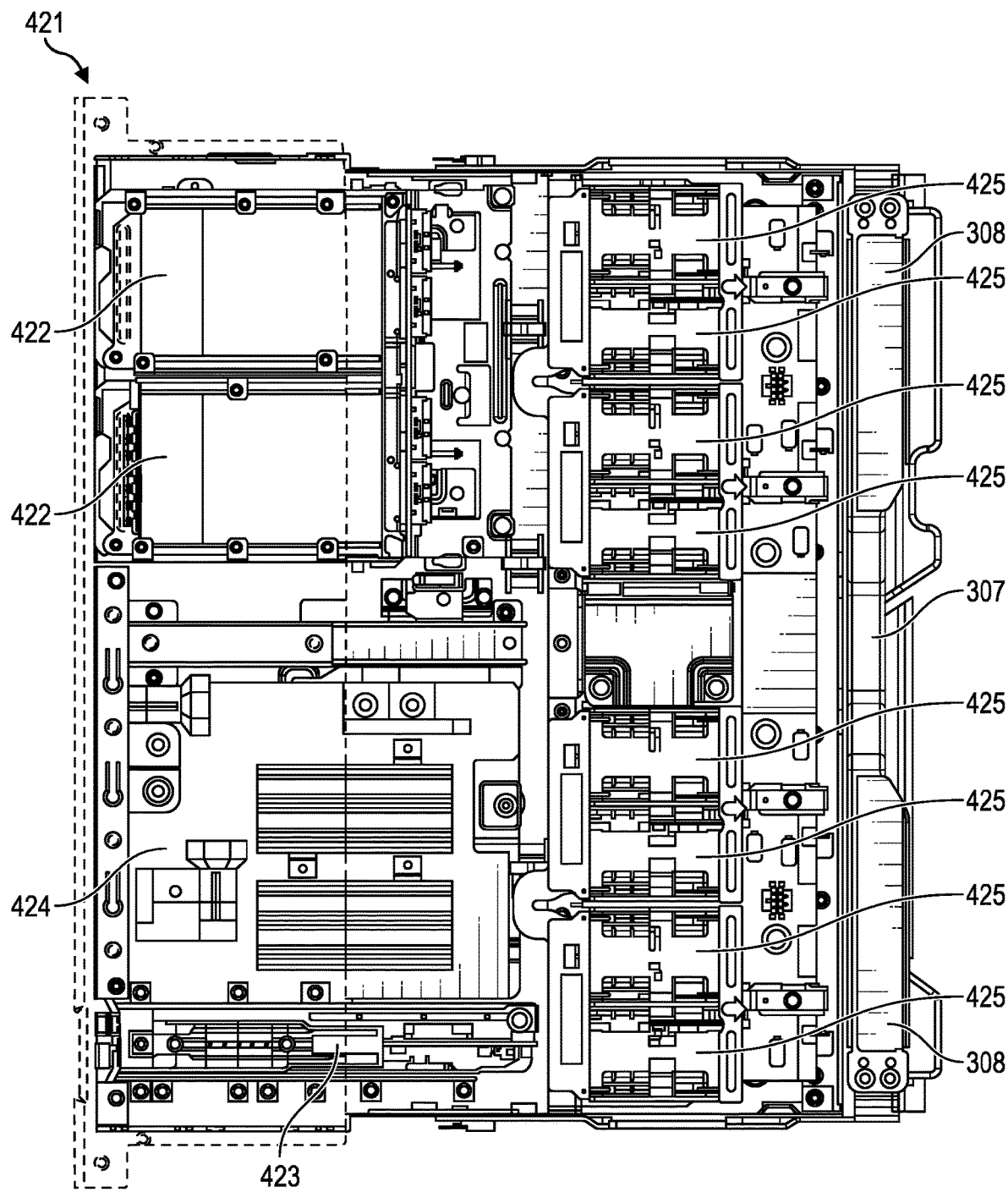

FIGS. 4A-C illustrate various exemplary embodiments of a modular storage tray for use with an IT enclosure. For example, the modular storage tray may be populated with various Solid-State Drives (SSDs), which are commonly used in client, hyperscale, and enterprise compute environments. SSDs are made from flash memory and can be built in many different form factors.

FIG. 4A illustrates a modular storage tray 401 having a plurality of drives 402 having an E3.S form factor. Modular storage tray 401 also has a Boot Optimized Storage Solution (BOSS) card 403. BOSS card 403 is a RAID (Redundant Array of Independent Disks) solution card designed for booting a server's operating system. Modular storage tray 401 also has a RAID controller 404. A number of fan units 405 are included in modular storage tray 401 to provide cooling for the storage solution, including E3.S drives 402, BOSS card 403, and RAID controller 404. The number and configuration of fan units 405 may be determined based upon the power required for the selected storage solution.

FIG. 4B illustrates a modular storage tray 411 having a plurality of drives 412 having a U.2 form factor. Modular storage tray 411 also has a BOSS card 413. Fan units 414 are included in modular storage tray 411 to provide cooling for the storage solution that includes U.2 drives 412 and BOSS card 413. The number and configuration of fan units 414 may be determined based upon the power required for the selected storage solution.

FIG. 4C illustrates a modular storage tray 421 having a plurality of drives 422 having an E3.S form factor. Modular storage tray 421 also has a BOSS card 423. Fan units 414 are included in modular storage tray 411 to provide cooling for the storage solution that includes U.2 drives 412 and BOSS card 413. Modular storage tray 421 further includes a power board 424, which may serve the entire IT enclosure and not just the storage solution on storage tray 421. Fan units 425 are included in modular storage tray 421 to provide cooling for the storage solution, including E3.S drives 422, BOSS card 423, and power board 424. The number and configuration of fan units 425 may be determined based upon the power required for the selected storage solution.

Although the E3.S and U.2 form factors are used in the example embodiments shown in FIGS. 4A-C, it will be understood that storage units having any appropriate form factor may also be used. For example, other form factors including E1.S, E2.L, E2.S 2T, E.3L, E.3L 2T, and M.2, which can range in power from 8.25 W to 70 W, may be used in the removable storage tray disclosed herein. The number and arrangement of fan units 405, 414, 425 may be selected to provide the required thermal solution that is tailored to the storage solution being offered.

As shown in FIG. 4C, the storage tray may also be used to hold non-storage components (e.g., power board 424) that may have difficulty fitting in the main IT enclosure.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below.

Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. An information technology (IT) equipment enclosure, comprising:
    a first portion of a chassis configured with one or more compute devices fixedly mounted to the chassis; and
    a second portion of the chassis configured to receive a removable storage tray module, the storage tray module configured with one or more storage devices and one or more cooling devices, wherein the removeable storage tray module further comprises a power board, the power board configured to manage power for the one or more compute devices.

2. The IT equipment enclosure of claim 1, wherein the removable storage tray module further comprises a handle, wherein the handle is pivotable between a locked position and an unlocked position.

3. The IT equipment enclosure of claim 2, wherein the handle comprises a recessed portion that is configured to route cables to the storage devices when the handle is in the locked position.

4. The IT equipment enclosure of claim 2, wherein the handle engages a sidewall of the chassis when in the locked position.

5. The IT equipment enclosure of claim 1, wherein the cooling devices are selected based upon the one or more storage devices on the storage tray module.

6. The IT equipment enclosure of claim 1, wherein the cooling devices are fans.

7. The IT equipment enclosure of claim 1, wherein the storage devices comprise one or more of a Solid-State Drive (SSD), a Boot Optimized Storage Solution (BOSS), and a Redundant Array of Independent Disks (RAID) storage.

8. An information handling system (IHS) comprising:
    one or more compute components;
    a chassis configured with infrastructure components arranged for housing the one or more compute components, the one or more compute components fixedly attached to the chassis; and a removeable storage tray having one or more storage components and one or more cooling components, wherein all of the storage components for the IHS can be changed by replacing the removeable storage tray, wherein the removeable storage tray further comprises a power board, the power board configured to manage power for the one or more compute components.

9. The IHS of claim 8, wherein the chassis is configured for components on two levels, and wherein the removeable storage tray is configured to fit in a portion of an upper level.

10. The IHS of claim 8, wherein the removeable storage tray is configured to accept storage components having two or more different form factors.

11. The IHS of claim 8, wherein the removable storage tray further comprises a handle, wherein the handle is pivotable between a locked position and an unlocked position.

12. The IHS of claim 11, wherein the handle comprises a recessed portion that is configured to route cables to the one or more storage components when the handle is in the locked position.

13. The IHS of claim 11, wherein the handle engages a sidewall of the chassis when in the locked position.

14. The IHS of claim 8, wherein the one or more cooling components are selected based upon the one or more storage devices on the removeable storage tray.

15. The IHS of claim 8, wherein the one or more cooling components are fans.

16. The IHS of claim 8, wherein the storage devices comprise one or more of a Solid-State Drive (SSD), a Boot Optimized Storage Solution (BOSS), and a Redundant Array of Independent Disks (RAID) storage.

17. A computing system, comprising:
a chassis adapted to receive information technology (IT) equipment arranged on a first level and a second level;
one or more compute devices fixedly mounted to the chassis in the first level and the second level; and
a removeable storage module coupled to the chassis in the second level, the removeable storage module having one or more storage components and one or more cooling components, wherein the removeable storage module further comprises a power board, the power board configured to manage power for the one or more compute devices.

18. The computing system of claim 17, wherein the removable storage module further comprises a handle, the handle pivotable between a locked position and an unlocked position, the handle having a recessed portion that is configured to route cables to the one or more storage components when the handle is in the locked position, and wherein the handle engages a sidewall of the chassis when in the locked position.

19. The computing system of claim 17, wherein the cooling components are fans, a number of said fans selected based upon a configuration of the one or more storage components on the removeable storage module, and wherein the storage components are selected from one or more of a Solid-State Drive (SSD), a Boot Optimized Storage Solution (BOSS), and a Redundant Array of Independent Disks (RAID) storage.

* * * * *